United States Patent

Hanrahan

[11] Patent Number: 5,120,622
[45] Date of Patent: Jun. 9, 1992

[54] LIFT-OFF PROCESS FOR PATTERNING DICHROIC FILTERS

[75] Inventor: Michael J. Hanrahan, Rochester, N.Y.

[73] Assignee: Eastman Kodak Company, Rochester, N.Y.

[21] Appl. No.: 475,587

[22] Filed: Feb. 5, 1990

[51] Int. Cl.⁵ ............................................. G03F 9/00
[52] U.S. Cl. ....................................... 430/7; 430/321; 430/322; 430/325; 430/326; 430/329
[58] Field of Search .................... 430/7, 156, 312, 315, 430/320, 322, 324, 325, 329, 330, 321, 4, 326

[56] References Cited

U.S. PATENT DOCUMENTS 3,873,313  3/1975  Horst et al. ........................ 430/312

OTHER PUBLICATIONS

86 *Surface Science*, 16 (Oct. 1979) by Shimomoto et al.
Frary et al., "Lift-off Techniques for Fine Line Metal Patterning" *Semiconductor International*, Dec. 1981, pp. 72-88.
Kramer et al., "Design and Manufacture of a Filter Set for a Multispectral Detector" *J. Imag. Tech.* Oct. 1986, pp. 270-279.

*Primary Examiner*—Marion E. McCamish
*Assistant Examiner*—Kathleen Duda
*Attorney, Agent, or Firm*—Raymond L. Owens

[57] ABSTRACT

A lithographic lift-off process includes coating a layer of positive resist material using a dynamic dispense on top of a preexisting layer of a different positive resist material. Thereafter, patternwise exposing both layers simultaneously and developing the exposed portions of both layers for a sufficient time to provide openings in the resists wherein the dynamic dispense layer overhangs the preexisting layer.

2 Claims, 2 Drawing Sheets

LIFT-OFF PROCESS FOR PATTERNING DICHROIC FILTERS

CROSS-REFERENCE TO RELATED APPLICATION

Reference is made to commonly assigned U.S. patent application Ser. No. 305,132, filed Feb. 2, 1989 to Hugh G. McGuckin and Michael P. Cunningham.

FIELD OF THE INVENTION

This invention relates to lithographic patterning processes which are particularly useful in making color filter arrays for solid state electronic sensors and displays.

BACKGROUND OF THE INVENTION

Color filter arrays are employed in combination with sensors to define color images or in combination with display devices to permit color images to be viewed. A common approach to producing color filter arrays has been to use organic dyes embedded in a layer which has been patterned by various techniques to render the appropriate filter pattern. This approach has two significant disadvantages. The spectral characteristics of the filter are controlled by the absorbance curves of the dye and layer materials. Altering the spectral characteristics, therefore, requires altering the dye or layer material, which can be a difficult and time consuming process. Furthermore, the dyes may be subject to fading with time especially under harsh environmental operating conditions such as high light levels, etc.

An alternative, which overcomes the disadvantages of the organic dye approach, has been to produce color filter arrays from interference filters made up of alternating layers of two dielectric materials with different refractive indices. Various combinations of pairs of dielectric materials and deposition and patterning techniques have been used. One particular interference filter which uses a metal and dielectric layer is known as a Fabry-Perot interference filter.

In some sense, there exists a synergistic relationship between the choice of dielectric materials and the lithographic patterning technique employed. Thorium fluoride, zinc sulfide and cryolite are often chosen because these materials exhibit good film properties and adhesion even when deposited at temperatures that are compatible with organic based resist systems. Kramer and Hoffman reported in the *Journal of Imaging Technology*, Vol. 12, No. 5, pages 270–279 (October 1986) on the production of a linear color filter set on a glass substrate. Cryolite and zinc sulfide where chosen as the low index and high index materials, respectively. These materials were selected so that the substrate temperatures could be kept low to prevent damage to the photoresist material. Sulfur from the zinc sulfide, however, has the potential of poisoning an electronic device. This is especially true when filters are fabricated directly onto a device. The filters were based upon an all dielectric Fabry-Perot broad bandpass design. Thirty-seven to forty-one alternating layers of material were deposited. To prevent stress cracking in the final filter, the use of several air anneal steps were required. The process required 2-3 days of preparation time for each filter and resulted in final filter thicknesses of 4.2 μm. Problems with chipping of the filter edge indicates that the resist cross-section may have been trapezoidal rather than the more desirable reentry profile typically used in lift-off processes and suggest that a "pseudo-lift-off" process was employed. See the next section for a discussion of this process. Using metal and a dielectric material (i.e., silver and silicon dioxide), Fabry-Perot interference filters are described in the above referenced McGuckin and Cunningham patent application.

The deposition of titanium dioxide and silicon dioxide stacks onto glass by sputtering techniques has been reported by Shimomoto et al (see 86 *Surface Science* 16 (1979). For their applications, a subsequent electrode deposition step was conducted at 500° C. The filters were sputtered to control the films and ensure that the filters would survive the electrode deposition step without any change in the spectral characteristics. A lift-off technique was required which could tolerate the temperatures encountered. This was accomplished using a double metal lift-off process employing aluminum and chrome. This process also involved patterning with an organic based resist system followed by transfer of the pattern into the metals. Cyan, yellow and magenta strip filters were produced with thicknesses of 1.2, 0.67 and 1.85 μm, respectively. Green and cyan dichroic filters have been made on glass using titanium dioxide and silicon dioxide dielectric stacks using photoresist as an etch mask. Using positive-working photoresist and dry etching techniques, areas of the yellow and cyan stack are removed to give a cyan and white filter.

The refractory oxides (i.e., silicon dioxide and titanium dioxide) represent good choices based on chemical compatibility with electronic devices and processing. However, these materials are usually deposited at significantly greater temperatures than desirable for a final manufacturing step. Excessive heating may damage the metallizations used for electrical conduction in the device. Therefore, the general approach has been to fabricate filters from these material onto glass substrates and attach the filters to devices using adhesives. Pattern transfer techniques may also be required making the process complicated and cumbersome. Lower temperature deposition techniques for these materials are not known.

Another technique employs a "pseudo-lift-off" process for patterning of brittle, dielectric materials. Conventional positive-working photoresists are lithographically patterned in the usual manner. The filter materials are deposited on top of the resist and onto the substrate through the openings in the resist. Immersion into a solvent removes the resist and unwanted filter areas by a cohesive failure mechanism. The technique relies upon the materials cracking along the edges of the resist pattern and is an inherently unreliable process.

Lithographic techniques based upon removing unwanted areas using photoresist as an etch mask are known. For etch processes, however, there are a number of problems which must be overcome. Chemistries which will attack both dielectric materials at comparable rates are needed. Then a masking material must be found which is compatible with that etch. Additional lithographic steps may be required to pattern the masking material. The process of patterning by etching also does not lend itself readily to changes in dielectric materials or deposition techniques.

Compared with etch processes, a lift-off process represents a good general purpose technique and offers some advantages in process simplicity. To achieve the maximum process control and resolution, it is desirable that a overhanging or reentry resist sidewall profile be generated. This more traditional technique has been used to pattern filters. However, this requires a resist lift-off process which can be coated thicker than the thickest filter. Typical thicknesses for dielectric stack filters are greater than 1 μm and usually range between 2 and 4 μm. Unfortunately, most lift-off processes which produce reentry sidewall profiles have been developed for metallization purposes where the resist coatings are 1 to 1.5 μm thick.

These types of lift-off processes can be categorized into four groups. Some lift-off systems are based upon combinations of light sources and chemistries which photochemically result in retrograde resist edge profiles after development. Image reversal techniques produce similar profiles. In image reversal, exposed areas are chemically altered to decrease solubility. Unexposed areas are subsequently exposed and developed away. The most widely employed technique is known as the chlorobenzene process. By treating a resist coating with chlorobenzene it is possible to alter the dissolution characteristics of the surface such that the overhang structure is produced during development. Silylation techniques have also been used which modify the etching characteristics of a resist surface. Multi-layer resist technology is an area that has received much investigation. Consequently, many permutations using two or three layers of different materials have been reported. A review article by Frary and Seese, *Semiconductor International*, pages 72–88 (December 1981), discusses the various approaches that have been explored. Of particular relevance is the discussion of structures comprising two layers of positive-working photoresist. The application of one resist onto another suffers from intermixing of the two similar materials such that the development characteristics gradually change throughout the layers; consequently it is difficult to produce the desired overhang structure. Plasma etch or thermal treatment has been used to alter the surface characteristics of the bottom resist layer to produce a "buffer" layer which prevents intermixing. This process allows the top resist layer to be coated uniformly and maintains the distinction between the two layers. Two resist materials may be chosen such that they either exhibit different dissolution rates in the same developer or else they use mutually exclusive developers. In this case, an overhang structure can be produced. Depending upon the treatment conditions used to form the buffer, it may be necessary to use a two step development process with an intermediate etch step to remove the buffer layer.

In terms of ease of manufacturability, the technique used for patterning dichroic filters should be as simple and robust as possible. In other words, the number of processing steps and critical process controls should be minimized. In addition, there should be a wide margin in control factor settings which still result in acceptable product. Etching processes, as indicated previously, require specific etch chemistry and material choices. Suitable masking and etch stop materials must be found that are compatible with the aforementioned etch chemistry. This usually means a pattern transfer process just to produce the appropriate pattern in the etch mask material. Dry etching techniques also have many process controls that have to be monitored and maintained in a manufacturing environment.

SUMMARY OF THE INVENTION

It is an object of this invention to provide a lithographic patterning process which eliminates the above problems and which results in an improved overhang lift-off structure.

This object is achieved by a lithographic patterning process which results in an overhang lift-off structure, comprising the steps of coating a layer of positive resist material using a dynamic dispense on top of a preexisting layer of a different positive resist material; patternwise exposing both layers simultaneously; and developing the exposed portions of both layers for a sufficient time to provide openings in the resists wherein the dynamic dispense layer overhangs the preexisting layer.

The lithographic process is characterized by the coating of one positive resist material, using a dynamic dispense, on top of a preexisting layer of a different positive resist material without the need of any additional processing steps to produce a "buffer" layer or to prevent interfacial mixing of the two materials. Any combination of positive-working photoresists may be used in this process. The only requirement is that the top layer material have a lower unexposed dissolution rate than the bottom layer using the same developer. Both layers are also patternwise exposed together. This gives a vertical sidewall profile in both layers regardless of the degree of undercut and this results in sidewall structures similar to an anisotropic etch process. The thickness of the individual layers are controlled by the coating process and may be varied easily. Typically, lift-off processes have been developed for thicknesses in the 1–1.2 μm range. However, dielectric stack color filters require lift-off processes in the 2–4 μm range. A process in accordance with this invention can be used to give lift-off structures in virtually any thickness range and is only limited by the thickness limits of the coating process and the materials employed. The degree of undercut is controlled only by the development time. The undercut is produced by dissolving unexposed resist material at a slow rate, therefore, the degree of undercut is easily controlled. This process results in an extremely simple and yet very robust technique for producing lift-off resist profiles in which the degree of undercut, height of overhang or thickness of the overhang layer can be manipulated easily and over a large range.

DETAILED DESCRIPTION OF THE PREFERRED EMBODIMENTS

Figure 1:
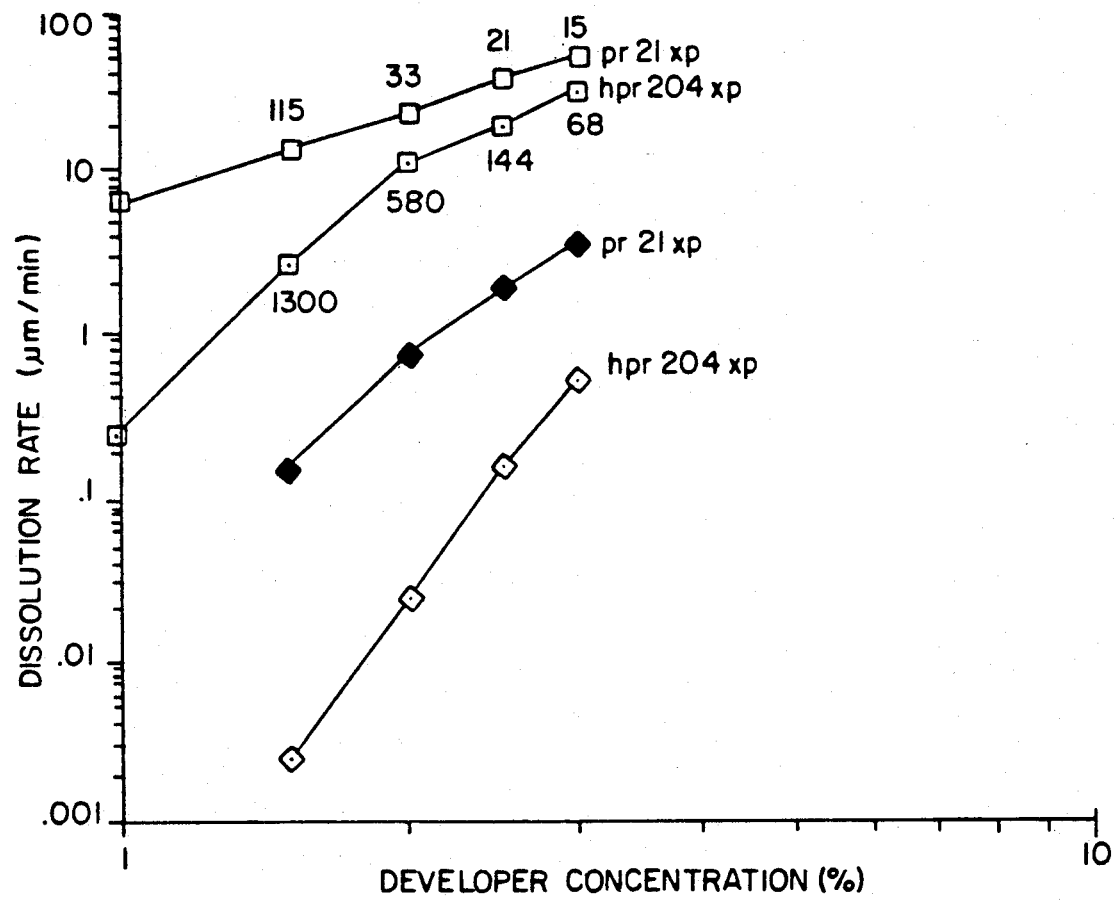
FIG. 1 is a graph of developer concentration versus dissolution rate for two positive resists using a particular developer.

Any combination of positive photoresists which fit the aforementioned criterion can be used to produce lift-off profiles. It is most desirable, however, to employ a resist as the top layer which has greater discrimination (i.e., ratio of exposed to unexposed dissolution rates) than does the lower layer in the same developer. FIG. 1 illustrates this point with two commercial available positive resists (i.e., Hunt HPR-204 and Baker PR-21 positive resists). More particularly, in FIG. 1 there is shown a comparison of dissolution rates for HPR-204 and PR-21 resist films that are exposed (xp) and unexposed (uxp) in various concentrations of a developer. Numerical values above PR-21xp and below HPR-204xp are discrimination values for the respective resist at that developer concentration. Discrimination is defined as the ratio of exposed to unexposed dissolution rates.

Exposed dissolution rate is the rate at which films exposed to actinic radiation dissolve in a specified developer. Unexposed dissolution rate is the rate at which the original film (without exposure) dissolves in the same developer.

At any given developer concentration it can be seen that the dissolution rates of HPR-204 are lower than PR-21. The dissolution rates show that an undercut profile will result because the unexposed PR-21 dissolves faster than the unexposed HPR-204. In lift-off processes, the linewidth of the upper layer is the critical dimension which controls the linewidth of the deposited material. The higher discrimination of the HPR-204 will ensure that the linewidth loss, as well as thickness loss, of the upper layer will be minimized. Linewidth is the width (as viewed from an angle normal to the wafer surface) of a pattern produced in the resist after exposure and development.

Figure 2A:
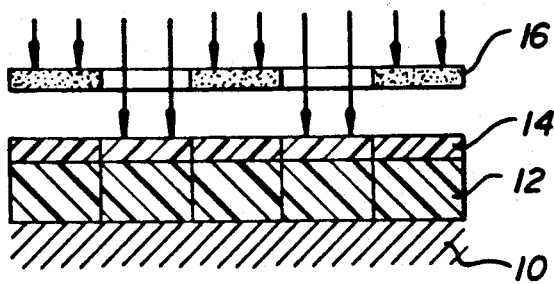
FIG. 2a–e show various steps in the method according to this invention.

FIGS. 2a-e are schematics which show the deposition of a dielectric color filter stack and final lift-off step. As shown in FIG. 2a, a first positive photoresist layer 12 was deposited on a substrate 10. Thereafter, a second different positive photoresist layer 14 (which has a lower unexposed dissolution rate than the first photoresist layer 12) is deposited on the first photoresist layer using a dynamic dispense mode. Dynamic dispense refers to dispensing of the second photoresist coating solution onto the middle of the wafer while the wafer is spinning.

Figure 2B:
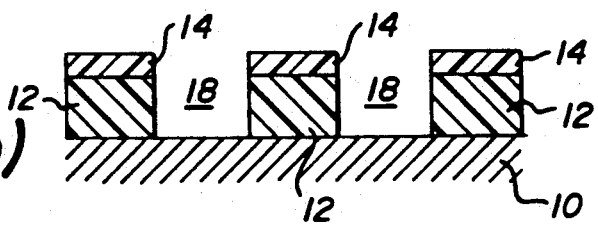
Figure 2C:
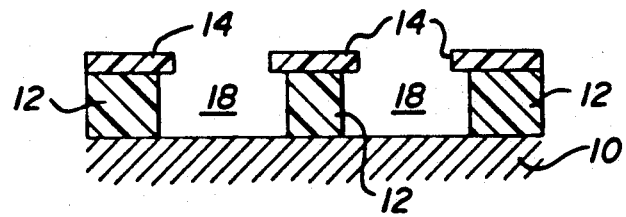
Figure 2D:
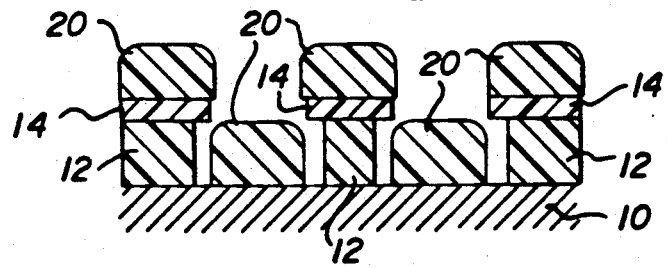
Figure 2E:
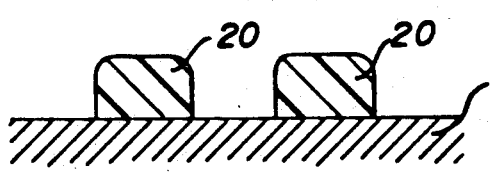

After a patternwise exposure of FIG. 2a in which a mask 16 having suitable arranged patterns of clear and opaque areas to produce the desired pattern in the photoresist layers, the exposed areas in both resist layers are developed rapidly to produce nearly vertical sidewalls in both layers (see FIG. 2b). Extended development provides openings 18 and results in removing more of the lower layer than the upper layer and produces an overhang (FIG. 2c) in the openings 18. Because the exposed lower layer is removed rapidly during the first part of the development process, the unexposed layer is attacked by the developer in a nearly uniform manner giving an iostropic undercut structure. Deposition of the dielectric color filter stack as shown in FIG. 2d results in a discontinuity between the material deposited on the substrate and on the resist. The deposition is performed in an evaporator equipped with two crucibles containing two materials of different refractive indices. Alternating depositions of each material is accomplished by alternating heating of each crucible. The substrates 10 are held in a holder which rotates during the deposition to improve coating uniformity. This discontinuity allows a solvent for the resist materials to dissolve away both resists, causing the dielectric stack deposited on the resist to float away in the solvent i.e. "lift-off" (see FIG. 2e). The solvent used may be the same as that used to produce the developed patterns in FIG. 2c. However, other solvents which are known to dissolve photoresist can be used.

EXAMPLE 1

A coating of an experimental batch of a photoresist solution composed of a 40% solids (by weight) of diazonaphthoquinone-based photoactive compound and a novolac polymer resin in an appropriate coating solvent was coated at 3000 RPM on cleaned 4" soda-lime glass wafers. The coatings were stored overnight to allow the coating solvents to evaporate. The coating thickness was 3 $\mu$m. Onto these coatings was coated Hunt HPR-204 resist using a dynamic dispense at 6000 RPM. The final coating thickness was 4.25 $\mu$m. The coatings were baked at 95° C. for 30 min and then exposed through an Optoline Resist Test mask (which contains a matrix of line/space pairs and exposure levels) at 20 LI on a Canon PLA contact exposing tool. The coatings were developed for 3 min. in a 0.125N concentration developer made up of a quaternary ammonium hydroxide, surfactant and de-ionized water. Additional coatings were exposed at 11 LI using a mask containing 90 $\mu$m by 38 mm lines and developed as above. Scanning electron micrographs (SEMs) of the edge of the resist pattern were obtained on cleaved samples and showed effective overhang lift-off structure.

Coatings were made as indicated in Example 1. The coatings were exposed at 10 LI and developed in a 0.175N developer for 30, 60, 120 and 240 sec. SEMs showed effective overhang lift-off structure.

EXAMPLE 2

Coatings were made on glass as in Example 1 except that a sample of 100 cst KTI-820 resist was coated as the bottom layer at 4500 RPM to give a coating thickness of 3 $\mu$m. Some of the coatings were baked on a hot plate at 125° C. for 50 sec. (5 sec. proximity). The HPR-204 was then coated as in Example 1. The coatings which were previously hot plate baked were again given the same bake. The wafers which were not previously baked were baked in a convection oven at 90° C. for 30 min. All coatings were exposed for 10 LI using the line mask and developed for 3 min. in a 0.175N concentration developer made up of a quaternary ammonium hydroxide surfactant and de-ionized water. Good development and overhang lift-off structures were observed. Both types of bakes gave similar results.

The invention has been described in detail with particular reference to certain preferred embodiments thereof, but it will be understood that variations and modifications can be effected within the spirit and scope of the invention.

I claim:

1. A lithographic patterning process which results in an overhang lift-off structure consisting of the steps of:
   (a) coating a layer of a first positive photoresist material on a substrate;
   (b) depositing a layer of a second positive photoresist material upon the first photoresist material by dispensing the second photoresist coating solution onto the middle of the coated substrate while it is spinning, the second photoresist layer having a lower unexposed dissolution rate than the first photoresist in a given developer;
   (c) patternwise exposing the first and second photoresist layers simultaneously; and
   (d) developing the exposed portions of the first and second resists with the given developer for a sufficient time to provide openings in the photoresists wherein the second photoresist layer overhangs the first photoresist layer.

2. A process for forming dielectric color filter arrays consisting of the steps of:
   (a) coating a layer of a first positive photoresist material on a substrate;
   (b) coating a layer of a second positive photoresist material upon the first resist by dispensing the second photoresist coating solution on the coated substrate while it is spinning, the second photoresist layer having a lower unexposed dissolution rate than the first photoresist in a given developer;

(c) patternwise exposing the first and second photoresist layers simultaneously;

(d) developing the exposed portions of the first and second photoresists with the given developer for a sufficient time to provide openings in the photoresists wherein the second photoresist overhangs the first photoresist layer;

(e) depositing a stack of dielectric layers on the unexposed portions of the second photoresist layer and in the openings to provide color filter arrays; and (f) applying a solvent to dissolve the first photoresist layer and to lift-off the dielectric stack on the second photoresist layer without affecting the color filter arrays.

* * * * *